(12) United States Patent
Yang et al.

(10) Patent No.: US 10,837,989 B2
(45) Date of Patent: Nov. 17, 2020

(54) SYSTEM AND METHOD TO CHARACTERIZE AND IDENTIFY OPERATING MODES OF ELECTRIC LOADS

(71) Applicant: EATON INTELLIGENT POWER LIMITED, Dublin (IE)

(72) Inventors: Yi Yang, Milwaukee, WI (US); Mayura Arun Madane, Maharashtra (IN); Prachi Suresh Zambare, Maharashtra (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 16/728,768

(22) Filed: Dec. 27, 2019

(65) Prior Publication Data

US 2020/0132735 A1 Apr. 30, 2020

Related U.S. Application Data

(63) Continuation of application No. 14/525,354, filed on Oct. 28, 2014, now abandoned.

(51) Int. Cl.
*G01R 19/165* (2006.01)
*G06F 1/28* (2006.01)
(52) U.S. Cl.
CPC ........ *G01R 19/16528* (2013.01); *G06F 1/28* (2013.01)
(58) Field of Classification Search
CPC .............................................. G01R 19/16528
See application file for complete search history.

(56) References Cited

U.S. PATENT DOCUMENTS

| 4,858,141 A | 8/1989 | Hart et al. |
| 5,483,153 A | 1/1996 | Leeb et al. |
| 5,717,325 A | 2/1998 | Leeb et al. |

(Continued)

FOREIGN PATENT DOCUMENTS

| EP | 2026299 A1 | 2/2009 |
| EP | 2051379 B1 | 1/2011 |

(Continued)

OTHER PUBLICATIONS

Energy Circle, "TED 5000 Series: The Energy Detective Electricity Monitor", http://www.energycircle.com/shop/ted-5000-g-with-google-power-meter.html, 2011, 5 pp.

(Continued)

*Primary Examiner* — Manuel A Rivera Vargas
(74) *Attorney, Agent, or Firm* — Eckert Seamans Cherin & Mellott, LLC

(57) ABSTRACT

A system characterizes and identifies one of a plurality of different operating modes of a number of electric loads. The system includes a processor; a voltage sensor providing a voltage signal for one of the electric loads to the processor; a current sensor providing a current signal for the one electric load to the processor; and a routine executed by the processor and structured to characterize the different operating modes using steady state and voltage-current trajectory features determined from the voltage and current signals, and to identify a particular one of the different operating modes based on a plurality of operating mode membership functions of the steady state and voltage-current trajectory features.

20 Claims, 11 Drawing Sheets

(56) References Cited

U.S. PATENT DOCUMENTS

| | | | |
|---|---|---|---|
| 5,835,901 A | 11/1998 | Duvoisin, III | |
| 5,910,875 A | 6/1999 | Tian et al. | |
| 6,081,123 A | 6/2000 | Kasbarian et al. | |
| 7,268,989 B2 | 9/2007 | Parker et al. | |
| 7,362,552 B2 | 4/2008 | Elms et al. | |
| 8,756,181 B2 | 6/2014 | Lu et al. | |
| 2006/0018060 A1 | 1/2006 | Elms et al. | |
| 2006/0227469 A1 | 10/2006 | Parker et al. | |
| 2007/0086124 A1 | 4/2007 | Elms et al. | |
| 2009/0072985 A1 | 3/2009 | Patel et al. | |
| 2011/0128153 A1* | 6/2011 | Sims | G06F 1/325 340/636.1 |
| 2013/0066479 A1 | 3/2013 | Shetty et al. | |
| 2013/0138669 A1* | 5/2013 | Lu | G06N 3/088 707/758 |

FOREIGN PATENT DOCUMENTS

| | | |
|---|---|---|
| GB | 2465367 A | 5/2010 |
| WO | 2008142173 A1 | 11/2008 |
| WO | 2010005985 A1 | 1/2010 |
| WO | 2010085816 A1 | 7/2010 |
| WO | 2011002735 A1 | 1/2011 |
| WO | 2011091444 A1 | 7/2011 |
| WO | 2013042100 A1 | 3/2013 |
| WO | 2013063786 A1 | 5/2013 |
| WO | 2013/157175 A1 | 10/2013 |

OTHER PUBLICATIONS

Lam, H.Y., et al., "A Novel Method to Construct Taxonomy of Electrical Appliances Based on Load Signatures", IEEE Transactions on Consumer Electronics, vol. 53, No. 2, May 2007, p. 653-660.

Hart, G.W., "Nonintrusive Appliance Load Monitoring", Proceedings of the IEEE, vol. 80, Dec. 1992, pp. 1870-1891.

Drenker, S. et al., "Nonintrusive Monitoring of Electric Loads", Computer Applications in Power, IEEE, Oct. 1999, pp. 47-51, vol. 12.

Marceau, M.L., et al., "Nonintrusive load disaggregation computer program to estimate the energy consumption of major end uses in residential buildings", Energy Conversion and Management, vol. 41, 2000, pp. 1389-1401.

Cole, A., et al., "Nonintrusive Identification of Electrical Loads in a Three-Phase Environment Based on Harmonic Content", Proc. IEEE Instrumentation and Measurement Technology Conference, IMTC 2000, vol. 1, May 1-4, 2000, pp. 24-29.

Chan, W.L., et al., "Harmonics Load Signature Recognition by Wavelets Transforms", Proc. International Conference on Electric Utility Deregulation and Restructuring and Power Technologies, DRPT 2000, Apr. 4-7, 2000, pp. 666-671.

Shaw, S.R., et al., "Nonintrusive Load Monitoring and Diagnostics in Power Systems", IEEE Transactions on Instrumentation and Measurement, vol. 57, No. 7, Jul. 2008, pp. 1445-1454.

Kohonen, T., "Self-Organizing Maps", Third Edition: Springer, 2001, ISBN: 3-540-67921-9, pp. i-ii; 104-37.

Chesnut, C., "Self Organizing Map AI for Pictures", http://www.generation5.org/content/2004/aiSomPic.asp, 2004, 16 pp.

Mahalanobis, P.C., "On the Generalized Distance in Statistics", Proceedings of the National Institute of Sciences of India, vol. II—No. 1, 1936, pp. 49-55.

Theodoridis, S., et al., "Pattern Recognition", Fourth Ed., Academic Press, 2009, ISBN: 978-1-59749-2720, pp. i-iii; 20-39 and 58-61.

Wikipedia Foundation, Inc., "Self-organizing map", http://en.wikipedia.org/wiki/Self-organizing_map, Oct. 6, 2011, 7 pp.

Y. Du, et al. "A Review of Identification and Monitoring Methods for Electric Loads in Commercial and Residential Buildings", 2010, pp. 4527-4533, Proc. 2010 IEEE Energy Conversion Conf. and Expo., Atlanta, GA.

Y.-H. Lin et al., "Applications of Hierarchical Support Vector Machines for Identifying Load Operation in Nonintrusive Load Monitoring Systems", Proceedings of the 8th World Congress on Intelligent Control and Automation, Jun. 21, 2011, pp. 688-693.

H.-T. Yang et al., "Design a Neural Network for Features Selection in Non-intrusive Monitoring of Industrial Electrical Loads", Proceedings of the 11th International Conference on Computer Supported Cooperative Work in Design, 2007, pp. 1022-1027.

A. Prudenzi, "A Neuron Nets Based Procedure for Identifying Domestic Appliances Pattern-of-Use from Energy Recordings at Meter Panel", Proceedings of the 2002 IEEE Power Engineering Society Winter Meeting, 2002, pp. 941-946.

J. Roos et al., "Using Neural Networks for Non-intrusive Monitoring of Industrial Electrical Loads", Proceedings of the IEEE Instrumentation and Measurement Technology Conference, 1994, pp. 1115-1118.

M. Endo et al., "Clustering Method Using Self-Organizing Map", Proceedings of the 2000 IEEE Signal Processing Society Workshop on Neural Networks for Signal Processing, 2000, pp. 261-270.

J. Costa et al., "Automatic Data Classification by a Hierarchy of Self-Organizing Maps", Proceedings of the 1999 IEEE International Conference on Systems, Man, and Cybernetics, 1999, pp. 419-424.

S. Chen et al., "Implementation of a Virtual-Instrument for Non-intrusive Intelligent Real-Time Load Monitoring", Proceedings of the lasted International Conference on Neural Networks and Computational Intelligence, 2003, pp. 174-178.

European Patent Office, "International Search Report and Written Opinion", dated Oct. 18, 2013, 13 pp.

M. Zeifman et al., "Nonintrusive Appliance Load Monitoring: Review and Outlook", IEEE Transactions on Consumer Electronics, vol. 57, No. 1, Feb. 21, 2011, pp. 76-84.

F. Kupzog et al., "Automatic Electric Load Identification in Self-Configuring Microgrids", Proceedings of the 9th IEEE Africon Conference, Sep. 23, 2009, 5 pp.

U.S. Department of Energy, "Annual Energy Review 2010", Oct. 2011, pp. 266-267, Energy Information Administration, Washington, D.C., DOC/EIA-0384(2010).

U.S. Department of Energy, "Annual Energy Outlook 2010: With Projections to 2035", Apr. 2010, pp. 57-62, Energy Information Administration, Washington, D.C., DOC/EIA-0383(2010).

Hendron, R., et al., "Development of an Energy-Savings Calculation Methodology for Residential Miscellaneous Electric Loads", Conference Paper, Aug. 2006, 15 pp., ACEEE Summer Study on Energy Efficiency in Buildings, Pacific Grove, CA, NREL/CP-550-39551.

Norford, L.K., et al., "Non-intrusive electrical load monitoring in commercial buildings based on steady-state and transient load-detection algorithms", 1996, pp. 51-64, Energy and Buildings, vol. 24.

Sultanem, F., "Using Appliance Signatures for Monitoring Residential Loads at Meter Panel Level", IEEE Transactions on Power Delivery, Oct. 1991, pp. 1380-1385, vol. 6, No. 4.

Laughman, C., et al., "Power Signature Analysis", IEEE Power and Energy Magazine, 2003, pp. 56-63, vol. 2.

Jian, L., et al., "Load Signature Study—Part I: Basic Concept, Structure, and Methodology", IEEE Transactions on Power Delivery, Apr. 2010, pp. 551-560, vol. 25, No. 2.

Srinivasan, D., et al., "Neural-Network-Based Signature Recognition for Harmonic Source Identification", IEEE Transactions on Power Delivery, Jan. 2006, pp. 398-405, vol. 21, No. 1.

Srivastava, S., et al., "PSO & Neural-Network Based Signature Recognition for Harmonic Source Identification", TENCON 2009—2009 IEEE Region 10 Conference, 2009, pp. 1-5.

Patel, S., et al., "At the Flick of a Switch: Detecting and Classifying Unique Electrical Events on the Residential Power Line", Proceedings of the 9th international conference on Ubiquitous Computing, 2007, pp. 271-288, Innsbruck, Austria.

Du, L., et al., "Self-Organizing Classification and Identification of Miscellaneous Electrical Loads", IEEE Power and Energy Society General Meeting, 2012, 6 pp., San Diego, CA.

Wikipedia, "Support vector machine", http://en.wikipedia.org/wiki/Support_vector_machine, 2011, 11 pp.

(56) References Cited

OTHER PUBLICATIONS

Verdu et al., Classification, Filtering, and identification of electrical customer load patterns through the use of self-organizing maps, IEEE Transaction of Power Systems, vol. 21, No. 4, 1672-1682 (2006).

German et al., Self organizing map (SOM) approach for classification of power quality events, ICANN 2005, LNCS 3696, pp. 403-408 (2005).

Daponte et al., Artifical neural networks in measurements, Measurement 23, 93-115 (1998).

Lubkeman et al., Unsupervised learning strategies for the detection and classification of transient phenomena on electric power distribution systems, Proceedings of the First International Forum on Applications of Neural Networks to Power Systems, pp. 107-111 (1991).

Yu-Hsiu Lin et al., "Applications of fuzzy classification with fuzzy c-means clustering and optimization strategies for load identification in NILM systems", 2011 IEEE International Conference on Fuzzy Systems, Jun. 27-30, 2011, Taipei, Taiiwan, pp. 859-866.

T. Hassan et al., "An Empirical Investigation of V-I Trajectory Based Load Signatures for Non-Intrusive Load Monitoring", IEEE Transactions on Smart Grid, vol. 5, No. 2, Mar. 2014, pp. 870-878.

European Patent Application, "International Search Report and Written Opinion of corresponding case PCT/US2015/049069", dated Nov. 17, 2015, 13 pp.

\* cited by examiner

SYSTEM AND METHOD TO CHARACTERIZE AND IDENTIFY OPERATING MODES OF ELECTRIC LOADS

CROSS-REFERENCE TO RELATED APPLICATION

This application is a continuation of, and claims priority under 35 U.S.C. § 120 from, U.S. patent application Ser. No. 14/525,354, filed Oct. 28, 2014, entitled "SYSTEM AND METHOD TO CHARACTERIZE AND IDENTIFY OPERATING MODES OF ELECTRIC LOADS", the contents of which are incorporated herein by reference.

This invention was made with Government support under DE-EE0003911 awarded by the Department of Energy National Energy Technology Laboratory. The Government has certain rights in this invention.

BACKGROUND

Field

The disclosed concept pertains generally to electric loads and, more particularly, to methods of characterizing and identifying operating modes of electric loads. The disclosed concept also pertains to systems for characterizing and identifying operating modes of electric loads.

Background Information

Power consumption monitoring and energy management of plug-in electric loads (PELs) inside buildings are often overlooked. By knowing the operating mode (e.g., operating status) of an electric load, energy savings can be achieved with effective management and control thereof. Also, operating mode and energy consumption of electric loads need to be communicated to building management systems in an automatic, low cost and non-intrusive manner.

Electric loads often present unique characteristics in outlet electric signals (i.e., voltage; current; power). Such load characteristics provide a viable mechanism to identify operating status (e.g., without limitation, active; standby) by analyzing the outlet electric signals.

Prior proposals include usage of wavelet coefficients obtained from wavelet transforms and event detection to detect switching of the load. Also, basic power quality related signatures (e.g., one or more of apparent power, cos(phi), active energy, reactive energy, frequency, period, RMS current, instantaneous current, RMS voltage, instantaneous voltage, current harmonic THD (total harmonic distortion) percentage, voltage harmonic THD percentage, spectral content of the current waveform, spectral content of the voltage waveform, spectral content of the active power waveform, spectral content of the reactive power waveform, quality of the network percentage, time, date, temperature, and humidity) are used as a signature to identify a load and its operating status.

For example, a load is in a standby mode when the current value obtained for each load current is less than a percentage of the maximum for each load current in the normal operating state. When an electric appliance plugged into a master socket consumes power less than a suitable threshold (e.g., that of standby power), then those peripheral sockets might be switched off automatically to cut further power consumption. While this may be true for some electric devices, other electric loads (e.g., without limitation, microwaves; refrigerators) have ON-OFF behavior which is a unique internal behavior of the electric load itself (e.g., a desktop computer low power mode). It is not user friendly if the "OFF" cycle of such a device is improperly considered to be a "standby" mode and such load is then turned OFF.

Known prior proposals suffer from several serious disadvantages in terms of accuracy, robustness and applicability, and do not differentiate a parasitic mode or low power mode.

International Pub. WO 2008142173 A1 discloses a method and system for detection of standby status in linear and non-linear loads and automatic disconnection thereof. A "standby state" is detected by detection of the normal operating state of the load, obtaining the maximum value of the current in the operating state, detection of entry into a "standby mode" of the load by establishing the "standby state" when the existing current value obtained in the load is less than a percentage of the maximum value of the current of the load in the normal operating state, starting timing at a determined time for the load when it goes into the "standby mode", and disconnection of the load and the detection when a value is reached of the timing without the load having returned to the normal operating state.

International Pub. WO 2011091444 A1 discloses automatic detection of appliances. An energy monitoring device is programmed to identify an electrical device coupled to a power supply, and a state of the electrical device, from a change in successive measurements of the power supply. Algorithms for determining a load signature for an electrical device and its state are disclosed. A stored table of load signatures for states is used to identify devices and states. Energy monitoring information is collected and presented to the user on a display, a remote display, or is transmitted over a network to a remote device.

U.S. Pat. Appl. Pub. No. 2013/0138669 discloses a system and method employing a hierarchical load feature database to identify electric load types of different electric loads. The process includes: (1) real-time measuring of current/voltage waveforms of a load being monitored; (2) extracting a high-dimensional feature vector of the load; (3) selecting a first layer feature set, and identifying which load category the monitored load belongs to in the first layer; (4) selecting a second layer feature set (which may be different than the first layer feature set), and identifying which load sub-category the monitored load belongs to in the second layer; and (5) selecting a bottom layer feature set (which may be different than the first and second layer feature sets), and identifying the load type as defined in the bottom layer. Items (3) to (5) provide online identification of the load type. These can also provide online identification of the load operating mode (e.g., without limitation, off, standby, on) and load health.

There is room for improvement in methods of characterizing and identifying operating modes of electric loads.

There is further room for improvement in systems for characterizing and identifying operating modes of electric loads.

SUMMARY

These needs and others are met by embodiments of the disclosed concept, which provides a more meaningful description of different operating modes of an electric device, its characterization, how these characteristics are related to the behavior of the device, and a membership function based algorithm to identify the operating mode of the device. The disclosed concept includes three components: (1) definitions of different operating modes of electric loads; (2) characterization of operating modes using steady state and VI (voltage-current) trajectory features; and (3) a mode detection algorithm for identification of the type of operating mode based on membership functions.

In accordance with one aspect of the disclosed concept, a system characterizes and identifies one of a plurality of different operating modes of a number of electric loads. The system comprises a processor; a voltage sensor providing a voltage signal for one of the electric loads to the processor; a current sensor providing a current signal for such one of the electric loads to the processor; and a routine executed by the processor and structured to characterize the different operating modes using steady state and voltage-current trajectory features determined from the voltage and current signals, and to identify a particular one of the different operating modes based on a plurality of operating mode membership functions of the steady state and voltage-current trajectory features.

As another aspect of the disclosed concept, a method characterizes and identifies one of a plurality of different operating modes of a number of electric loads. The method comprises providing a voltage signal for one of the electric loads to a processor; providing a current signal for the one of the electric loads to the processor; and characterizing by the processor the different operating modes using steady state and voltage-current trajectory features determined from the voltage and current signals, and identifying a particular one of the different operating modes based on a plurality of operating mode membership functions of the steady state and voltage-current trajectory features.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a controller; a microprocessor; a microcontroller; a microcomputer; a central processing unit; a mainframe computer; a mini-computer; a server; a networked processor; or any suitable processing device or apparatus.

The disclosed concept is described in association with example loads and example load features, although the disclosed concept is applicable to a wide range of loads and a wide range of load features.

The disclosed concept can be employed by power strips, smart power strips, receptacles, outlets, power/energy meters, and power/energy monitoring at a circuit branch level for building energy management. The determined operating mode can minimize unnecessary nuisance trips that result when plugged-in loads are improperly turned off. Also, the operating mode information provides visibility to users with power/energy consumption breakdowns by various operating modes. This information provides awareness of how much power/energy is consumed while a load is functioning/operating (or actually in use), and how much energy is still consumed (or wasted) when a load is not really in use. This energy is also called parasitic or vampire energy consumption. This information can identify the potential energy saving opportunities from loads. Furthermore, the information is also helpful to detect failure or health of loads, particularly for those compressor-based loads (e.g., without limitation, refrigerators; coolers) with periodic duty cycles switching between the operating mode and a parasitic/low power mode. The idea is to compare healthy condition mode parameters to faulty mode parameters.

Figure 1:
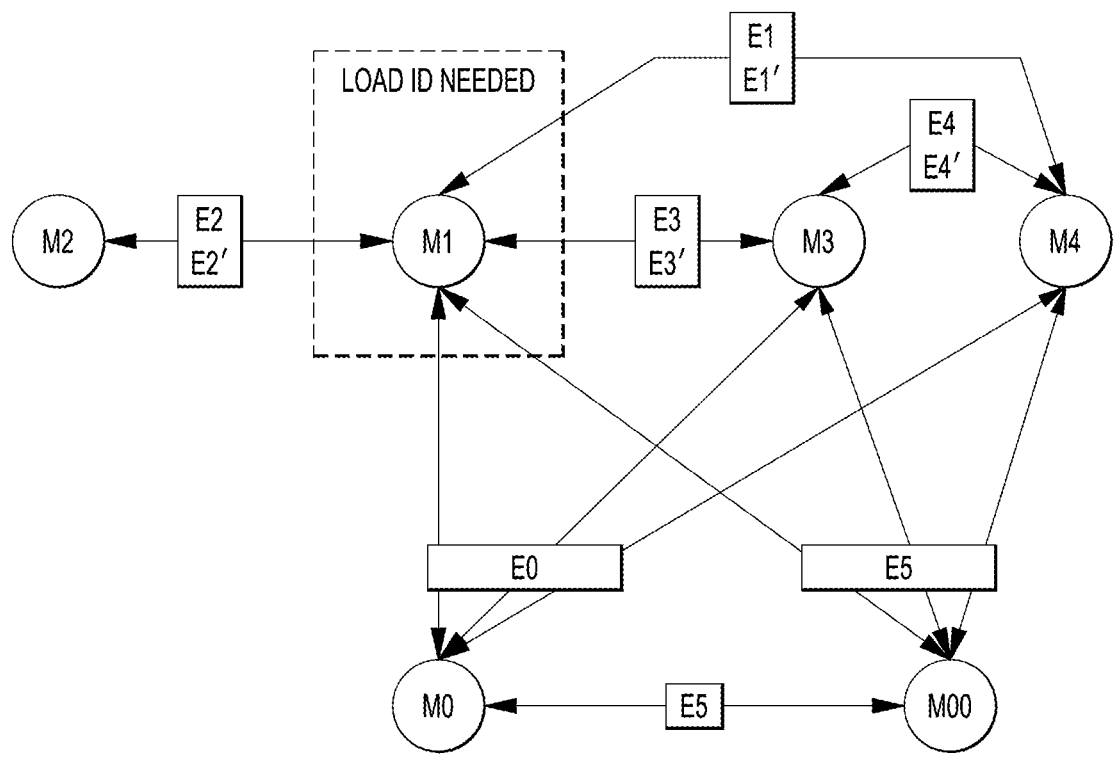
FIG. 1 is a mode transition state diagram in accordance with embodiments of the disclosed concept.

Referring to FIG. 1, a mode transition state diagram is shown. Electric loads show certain mode transition behaviors depending on the types of loads, as well as the user's behaviors. The mode transition state is dependent on the type of event. For FIG. 1, three components (shown in FIG. 9) include a power strip outlet relay (RL) 3, an electric load such as a plugged load (LD) 4, and a power strip (PS) 5. Also, six operating modes include the load operating mode M1, the load low power mode M2 (e.g., without limitation, standby; hibernating; energy saving), the parasitic mode M3 (the load is locally switched off but is still electrically connected to mains power and is still consuming a relatively small amount of power), a mode M4 in which no load is plugged into the PS outlet 20 (FIG. 9), a PS outlet switched off mode M0, and a mode M00 in which the entire PS is plugged off or switched off.

Table 1 shows the modes versus the status of the components.

TABLE 1

| Mode | RL | LD | PS | Power | Remarks |
|---|---|---|---|---|---|
| M1 | ON | ON | ON | +++ | Load ID needed |
| M2 | ON | ON | ON | ++ | Always followed by M1 |
| M3 | ON | OFF | ON | + | Parasitic mode |
| M4 | ON | NULL | ON | 0 | RL = ON; Power = 0; no load connected |
| M0 | OFF | X | ON | 0 | RL = OFF |
| M00 | x | X | OFF | x |  |

The following mode transition actions or event definitions are used in FIG. 1. At E1, a load is plugged into an outlet, the load is turned ON and it is locally ON. At E1 a load is plugged out of an outlet and the load is removed when it was locally ON. At E2, a load intelligently switches to low power, and at E2', the load wakes up from low power. At E3, a load is locally turned off from a local mechanism (e.g., without limitation, button; switch), and at E3 the load is locally turned on from the local mechanism. At E4, a load is plugged into an outlet but is locally off, and at E4', the load is plugged out of the outlet when it was locally off. At E0, the outlet relay OR is switched ON/OFF. At E5, the entire power strip PS is plugged into a wall outlet or is turned on.

For characterization of the operating modes, three features are calculated per Equations 1-3:

$$THD_{>7} = \sqrt{\left(\frac{I_{RMS}}{I_1}\right)^2 - 1 - I_{3\_nom}^2 - I_{5\_nom}^2 - I_{7\_nom}^2} \quad \text{(Eq. 1)}$$

$$P_{avg} = \frac{1}{n} * \sum_{k=1}^{n} v[k] \times i[k] \quad \text{(Eq. 2)}$$

$$A = \frac{1}{2}\left|\sum_{i=0}^{N-1} (x_i y_{i+1} - x_{i+1} y_i)\right| \quad \text{(Eq. 3)}$$

wherein:

$THD_{>7}$ is total harmonic distortion greater than the seventh harmonic;
$I_{RMS}$ is RMS current;
$I_1$ is current at the first harmonic;
$I_{3\_nom}$ is nominal current at the third harmonic;
$I_{5\_nom}$ is nominal current at the fifth harmonic;
$I_{7\_nom}$ is nominal current at the seventh harmonic;
$P_{avg}$ is average power;
n is an integer number of samples;
k is an integer;
v[k] is the $k^{th}$ voltage sample;
i[k] is the $k^{th}$ current sample;
A is area of a voltage-current (VI) plot;
N is an integer number of samples in the VI plot;
i is an integer; and
$x_i$ and $y_i$ are the $i^{th}$ normalized voltage and $i^{th}$ normalized current samples, respectively, in the VI plot.

For the no load mode M4, no load is not related to electric loads but is related to power strips or power outlets. In order to non-intrusively know the presence of a load, it is important to distinguish no-load versus with-load conditions. When no load is electrically connected at an outlet, the current waveform pattern is relatively random in nature, it shows low power, and there is relatively high distortion in the current waveform. This can be determined from the current waveform of a suitable number of samples, and the plot of the VI trajectory for a suitable number of samples. In M4 mode, there is a relatively very small amount of power measured at an outlet where there is no load connected. The amount of power consumption varies from outlet to outlet. For example and without limitation, real power consumption is less than about 3 W. Also, distortion caused by relatively higher order harmonics is relatively very high. $THD_{>7}$ is relatively very high when the load is in M4 mode. Otherwise, when the load is in the M1 or M3 or M2 mode, distortion caused by greater than the $7^{th}$ harmonic is not as high as compared to distortion in M4 mode. As a result, real power and $THD_{>7}$ (%) are used for characterization of the no load mode M4.

The parasitic mode M3 occurs when the device is switched OFF from, for example, a local button of the device which is still plugged at the outlet. Electric loads electrically connected at the outlet, but switched OFF, locally consume some amount of power to supply, for example, internal power supplies, LED lights, and circuits energized even when the device is plugged. The load in the parasitic mode can be switched OFF and, thus, identify opportunity for energy savings. For example, power may be consumed by some non-intelligent loads (e.g., without limitation, food processors; bread toasters; coffee makers) because of LED lights and internal power supplies. Similarly, power may be consumed by some intelligent devices (e.g., without limitation, desktop computers; LCD televisions) because of microcontroller circuits that are energized after plug in.

Real power consumed by a load when it is in the parasitic mode is less than real power consumed when the load is in the operating mode. Real power consumed by loads in the parasitic mode is relatively small individually but can have significant impact on the overall building energy consumption. VI trajectory (i.e., a graph or plot of normalized voltage versus normalized current for a single power cycle) gives valuable information about the parasitic mode. The difference in the VI trajectory during the parasitic mode and the operating mode for some of the loads is explained below.

Figure 2A:
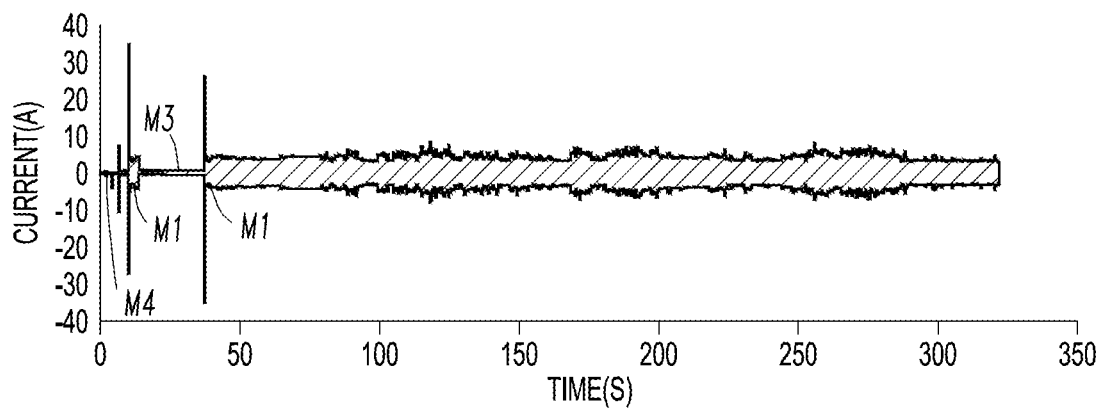
FIG. 2A is a plot of load input current versus time showing different operating modes of a desktop computer in accordance with embodiments of the disclosed concept.
Figure 2B:
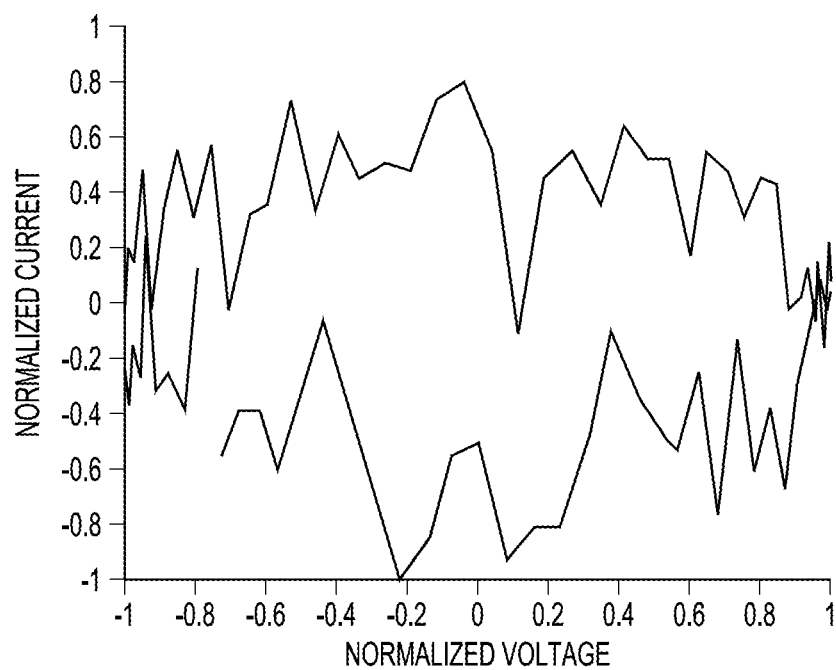
FIGS. 2B and 2C are plots of voltage-current (VI) trajectory of the desktop computer of FIG. 2A during parasitic and operating modes, respectively.
Figure 2C:
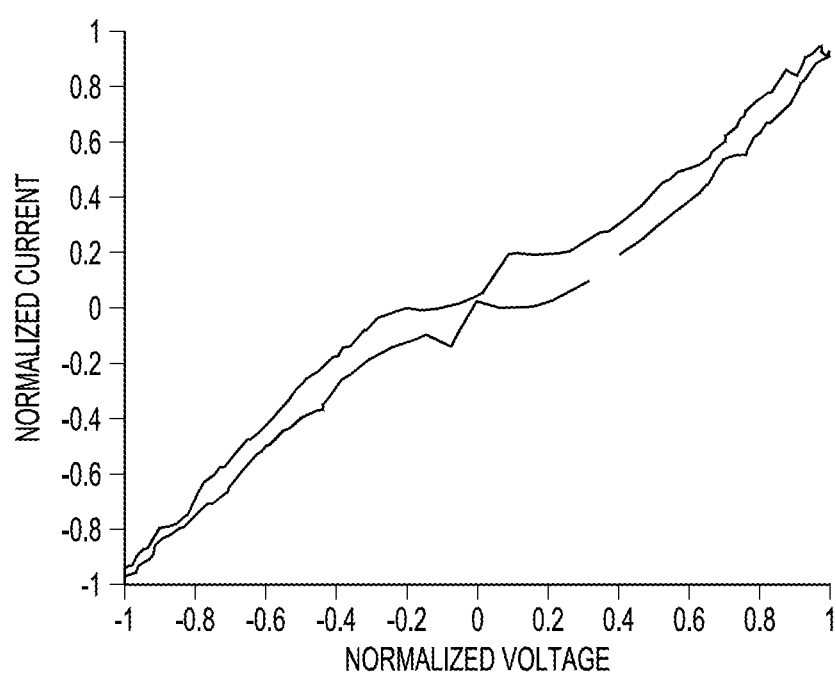

A desktop computer, when connected at the outlet, does initialization and then goes to the parasitic mode. The desktop computer has to be turned ON from a local button and then immediately starts operation of a power-on self-test (e.g., without limitation, memory, keyboard, disk, CDROM) and starts the operating system. Turn ON of the local button depends on the user operation. The desktop computer consumes some amount of power in the parasitic mode because of internal power supplies, LED lights and internal microcontroller circuits energized after plug-in. FIG. 2A shows a waveform including the different operating modes of the desktop computer. Modes M4, M1, M3 and M1 are shown. FIGS. 2B and 2C show the VI trajectory of the desktop computer during the parasitic and operating modes, respectively.

Figure 3A:
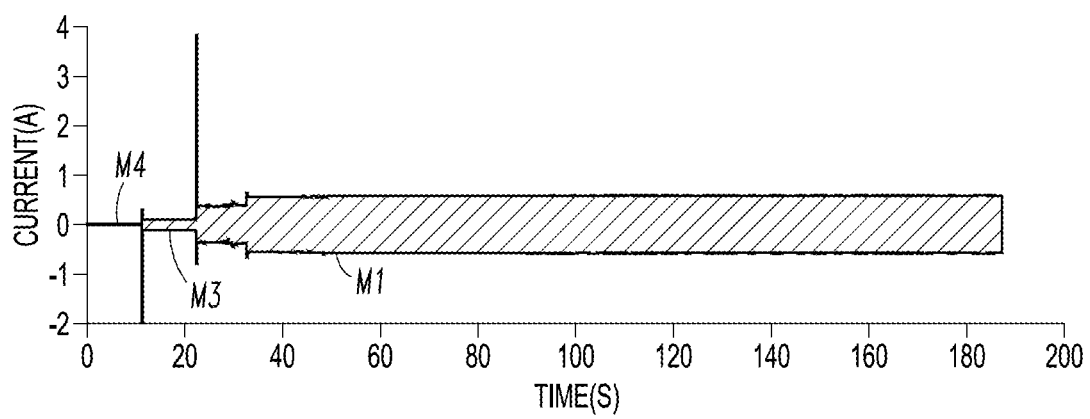
FIG. 3A is a plot of load input current versus time showing different operating modes of an LCD television in accordance with embodiments of the disclosed concept.
Figure 3B:
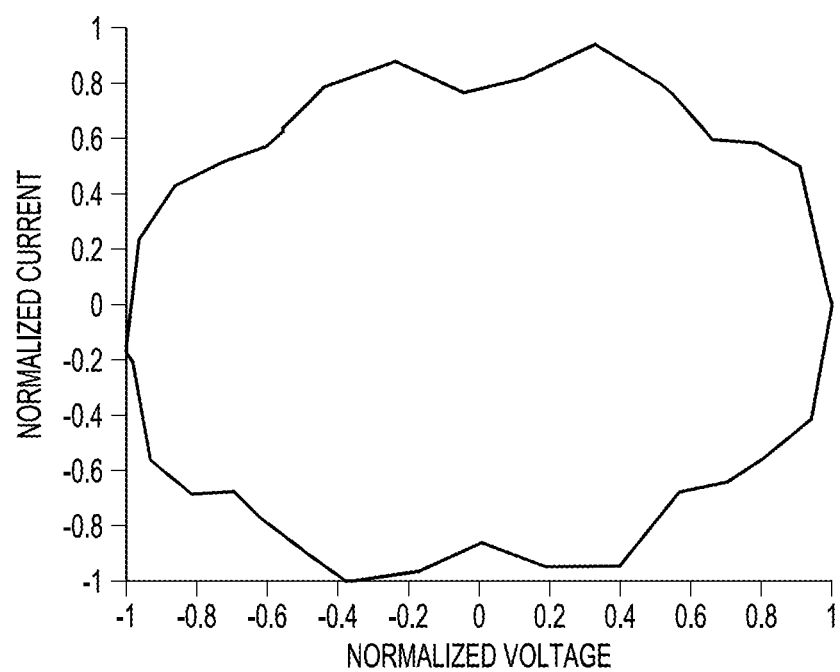
FIGS. 3B and 3C are plots of the VI trajectory of the LCD television of FIG. 3A during parasitic and operating modes, respectively.
Figure 3C:
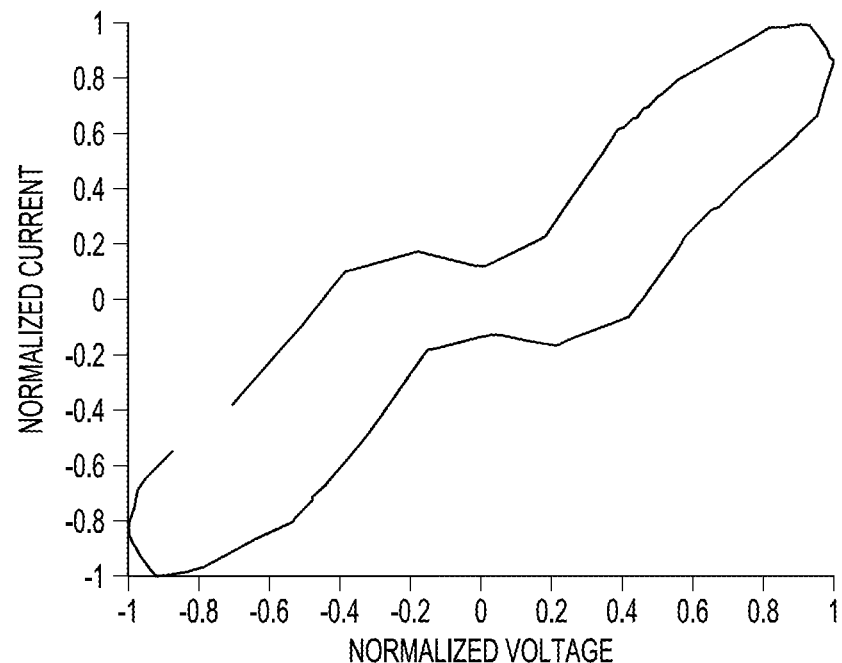

Another example is an LCD television. There are three possibilities when the LCD television is plugged in at the outlet: (1) it can directly go to the operating mode if a signal is available; (2) its local button is OFF, power may be consumed by internal circuitry or LED backlight, and the amount of power consumed may vary from manufacturer to manufacturer and depends on various factors (e.g., without limitation, circuit design; size); and (3) the LCD television is switched OFF from a remote control. FIG. 3A shows a load input current waveform including the different operating modes of the LCD television. Modes M4, M3 and M1 are shown. FIGS. 3B and 3C show the VI trajectory of the LCD television during the parasitic and operating modes, respectively.

Figure 4A:
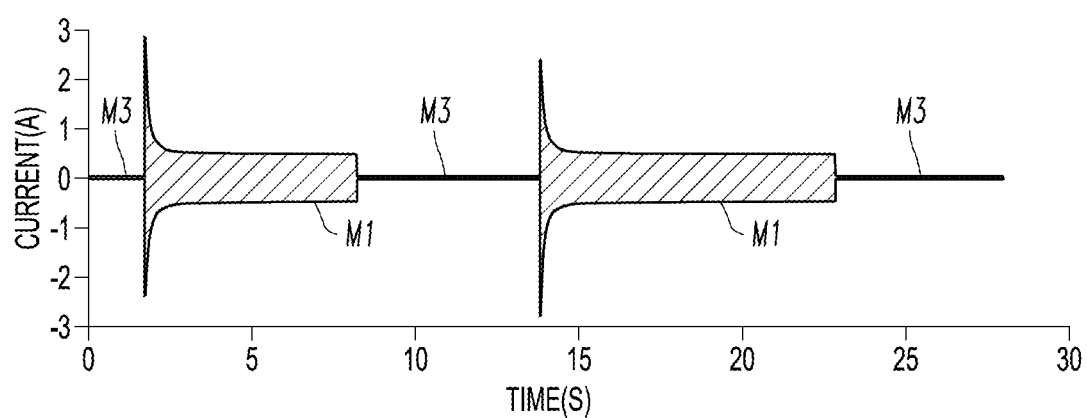
FIG. 4A is a plot of load input current versus time showing different operating modes of a food processor in accordance with embodiments of the disclosed concept.
Figure 4B:
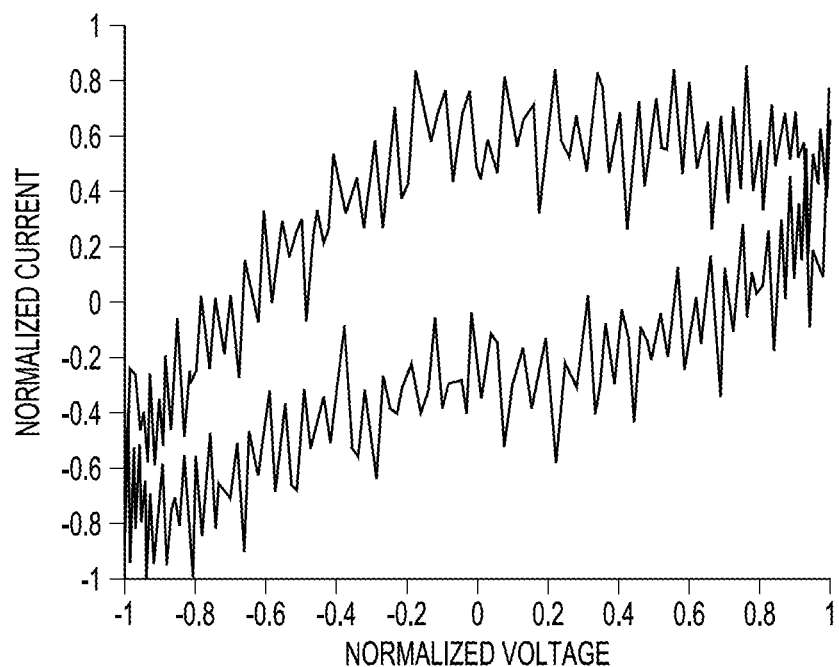
FIGS. 4B and 4C are plots of the VI trajectory of the food processor of FIG. 4A during parasitic and operating modes, respectively.
Figure 4C:
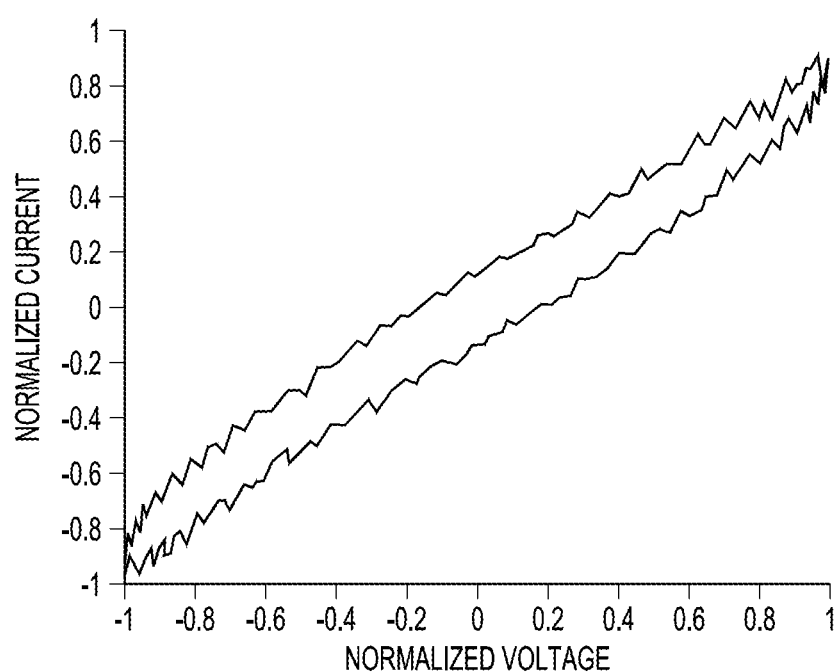

A further example is a food processor. When electrically connected at the outlet, the food processor goes to the operating mode M1 only when a user turns ON the local ON button. It operates for a relatively very short time and then goes to the standby mode. FIG. 4A shows a waveform including the different operating modes of the food processor. Modes M3, M1, M3, M1 and M3 are shown. FIGS. 4B and 4C show the VI trajectory of the food processor during the parasitic and operating modes, respectively.

For example, in a food processor type of load, M1 is the mode in which the food processor is actually used for food processing (i.e., ON), by turning ON the knob/button (available on the food processor). The food processor is stopped by again using the knob/button. Thus, when the knob is in the STOP/OFF position, the food processor goes to the M3 parasitic mode, as it is only plugged into the outlet and consuming parasitic power. This is analogous to a desktop PC waiting for a user to use a button to start the same. Additionally, the food processor goes to the parasitic mode M3 by user activity and not on its own, which is not treated as the low power mode M2.

Figure 5A:
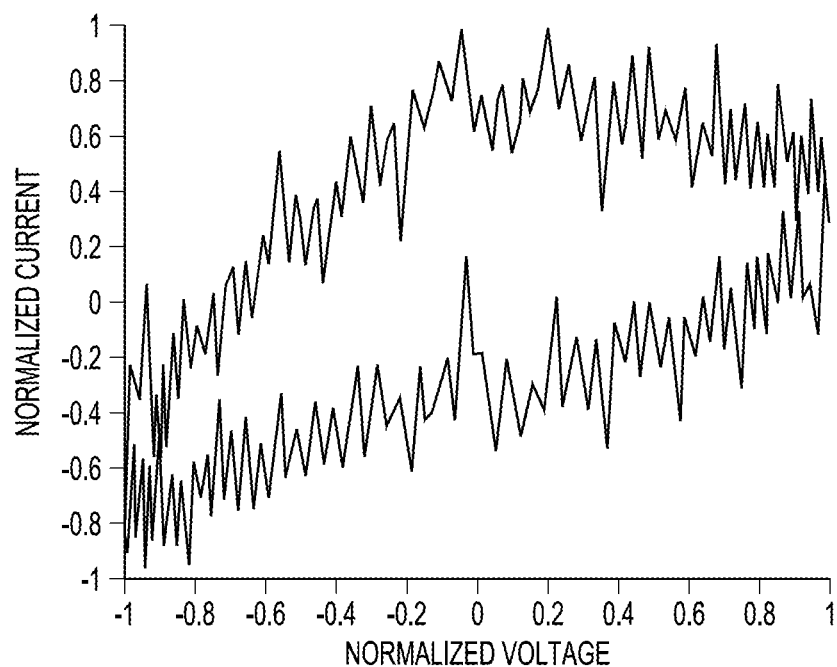
FIGS. 5A and 5B are plots of the VI trajectory of an AC-DC adapter when no load is electrically connected to the adapter in the parasitic mode, and when the load is electrically connected to the adapter in the operating mode, respectively.
Figure 5B:
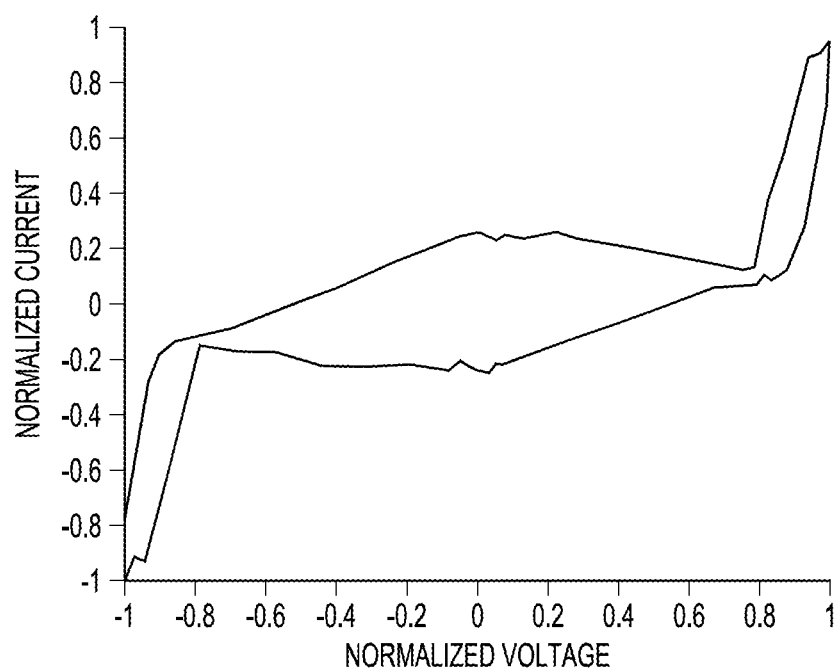

A still further example is an AC-DC adapter or charger. Loads like adapters and chargers do not have a local ON/OFF button. These loads can be said to be switched OFF only when they are plugged OFF from the outlet. For example, a cell phone charger consumes power even when the cell phone battery is fully charged or the cell phone charger is not electrically connected to the cell phone. FIGS. 5A and 5B respectively show the VI trajectory of an adapter when no load is electrically connected to the adapter (parasitic mode) and when the load is electrically connected to the adapter (operating mode).

From the above four examples (FIGS. 2A-2C, 3A-3C, 4A-4C, and 5A-5B), the VI trajectory of the load in the parasitic mode M3 has a relatively larger area than its VI trajectory in the operating mode M1. For a majority of the loads, the area has a negative sign, which occurs when the current lags the voltage. Otherwise, if the current leads the voltage, then the area has a positive sign. For some of the reactive loads, the area has a positive sign in the parasitic mode. The area is proportional to the magnitude of the phase shift between the voltage and the current. Relatively small or minimal real power and relatively large negative area are the features used for identification of the parasitic mode.

Figure 6A:
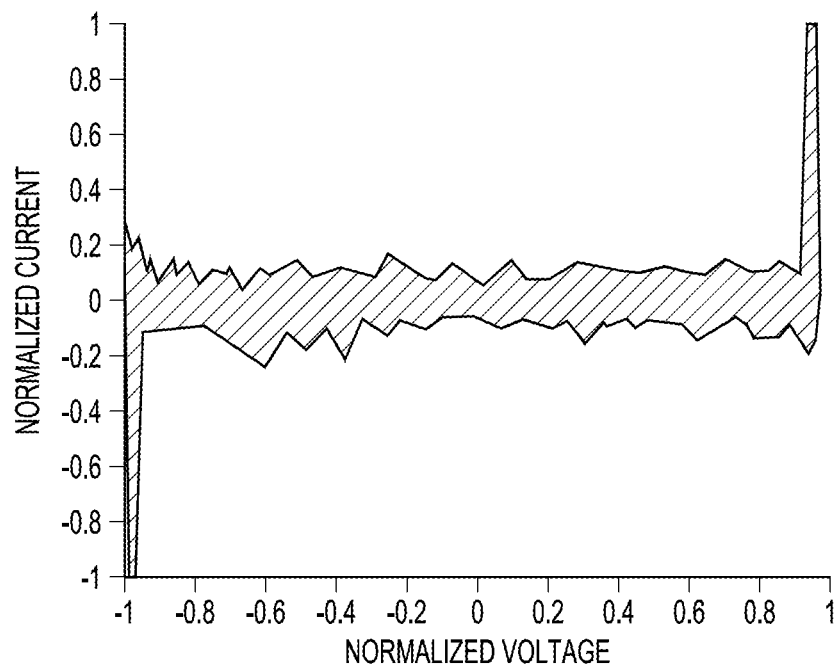
FIGS. 6A-6F are plots of the VI trajectory of a battery charger, a bread toaster, a refrigerator, a microwave oven, a space heater and an LCD television during the active mode.
Figure 6B:
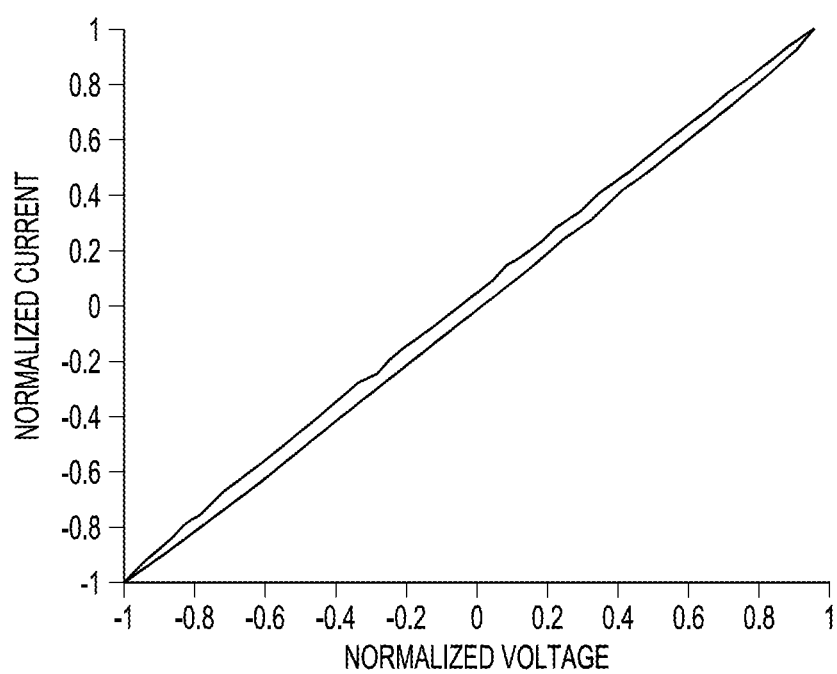
Figure 6C:
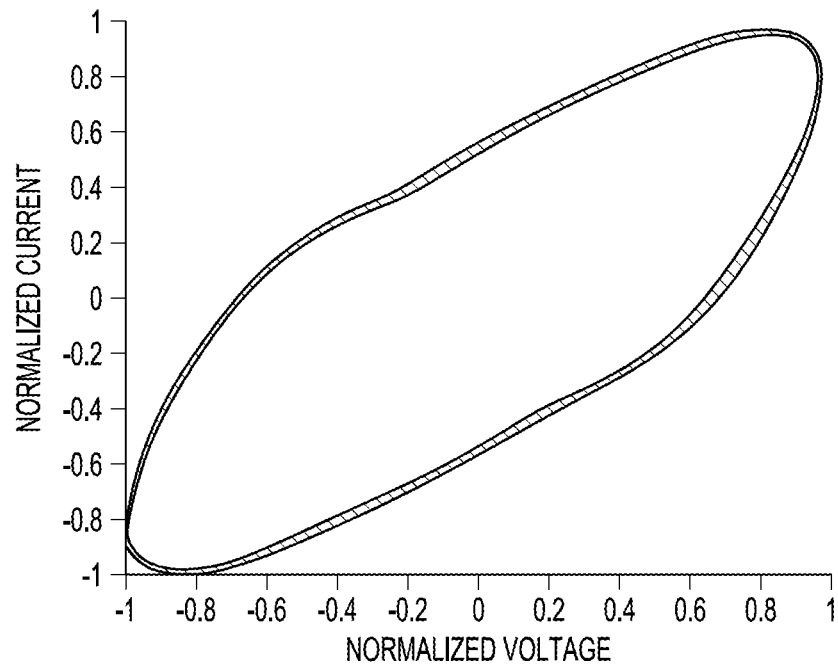
Figure 6D:
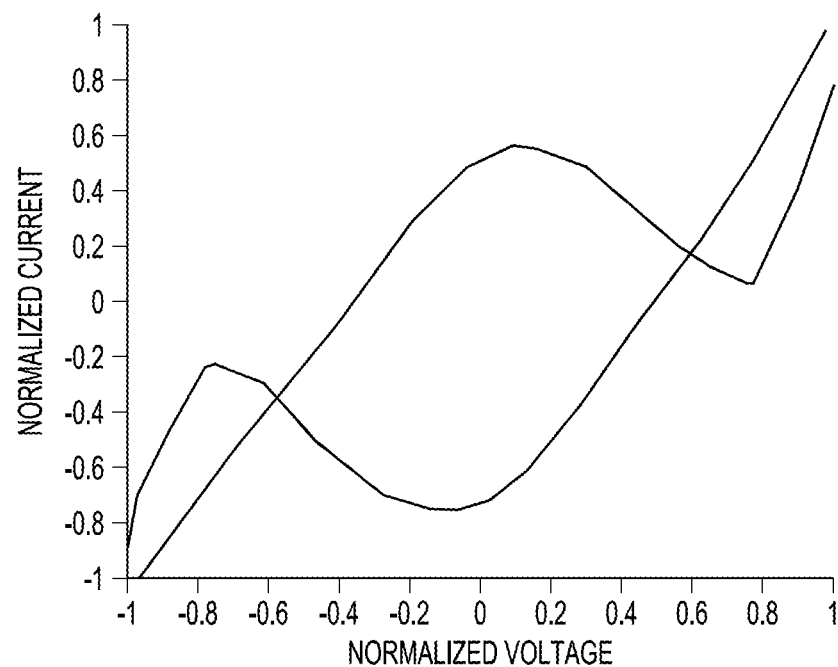
Figure 6E:
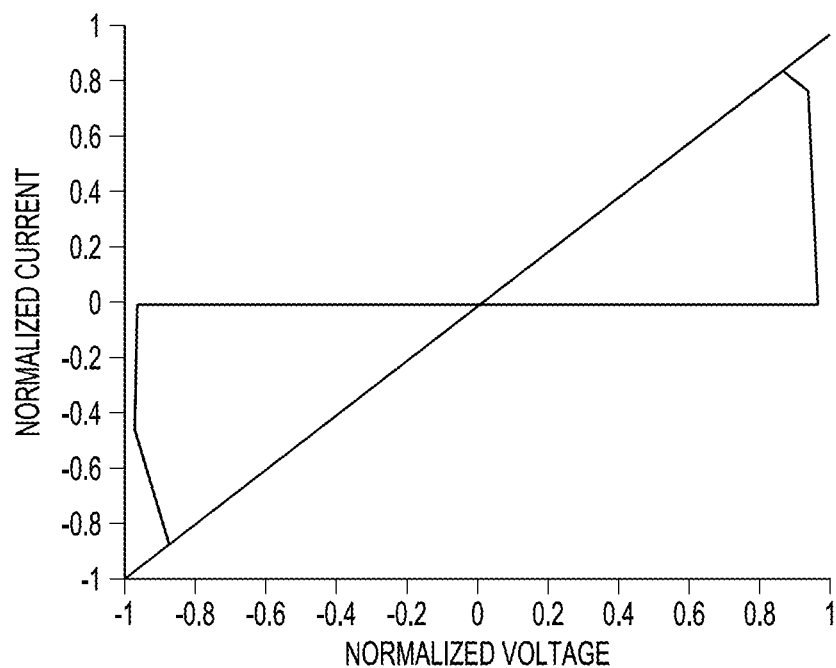
Figure 6F:
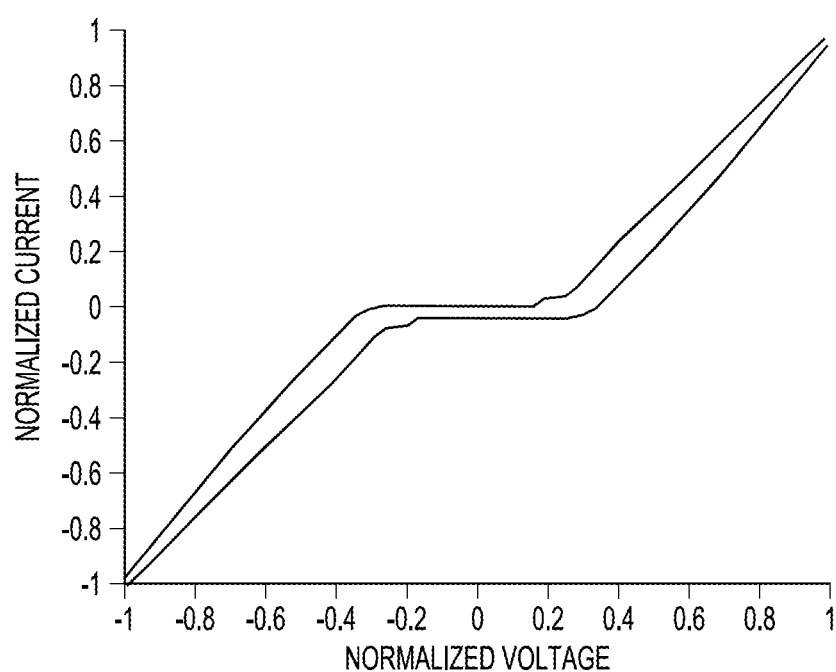

The active mode M1 is the mode when the load is actually doing its intended function (i.e., it is in the operating mode). Real power consumption is greater in M1 as compared to M4 and M3 for most of the loads. Power consumption is less in case of some loads like, for example, a cell phone charger or adapter, or a lamp load with a relatively low power rating. Other features, such as $THD_{>7}$, is not as high as that of M4 and the VI trajectory area is less (e.g., a relatively small negative or positive value). FIGS. 6A-6F show the VI trajectory of various loads during the active mode. In FIGS. 6A and 6B, respectively, a battery charger and a bread toaster both have a relatively small negative area. In FIG. 6C, a refrigerator has a positive area. In FIGS. 6D-6F, respectively, each of a microwave oven, a space heater and an LCD television has a relatively small negative area.

Figure 7:
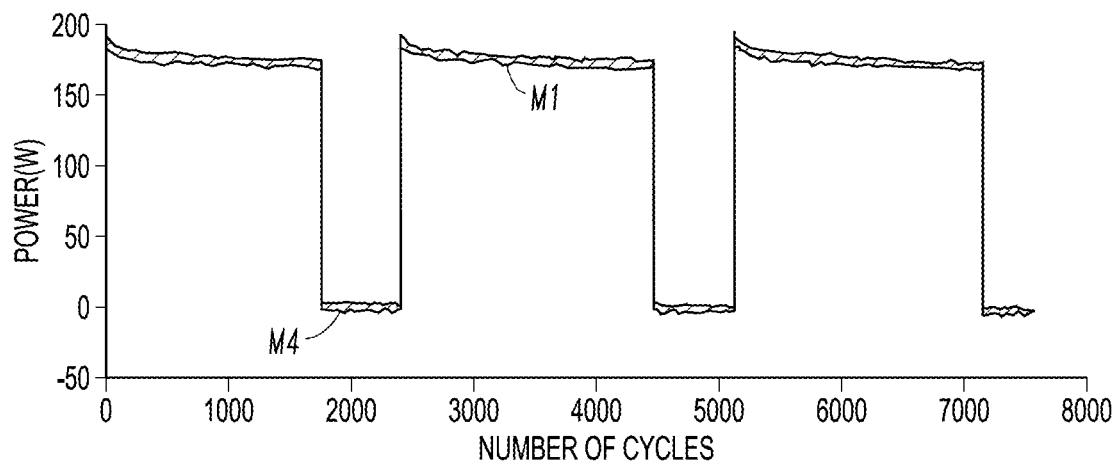
FIG. 7 is a plot of power versus line cycles for a space heater.

In the standby mode M2, this low power mode M2 always follows the active mode M1. Several examples of the low power mode include the energy saver mode of a printer, the screen saving mode of an LCD monitor, an idle mode of a desktop computer, and the ON-OFF behavior of various loads such as, for example, a space heater or an iron. Also, there is a relatively large change in the real power when the load goes from the M1 mode to the M2 mode. This relatively large change in power is used to differentiate the standby mode. Loads like the space heater exhibit ON-OFF behavior, which is the internal behavior of the load as shown by the power profile of FIG. 7.

For the design of the disclosed mode detection algorithm, representative data is collected for various different types of loads including relatively low power through relatively high power loads. Various electric features are calculated for this data. The features distribution is analyzed in histogram plots (not shown) to identify the differentiating features which have clear range boundaries between the different operating modes. The values which are distinct for the particular mode and which do not majorly overlap with other modes are taken as the thresholds for a sigmoid function.

Figure 8A:
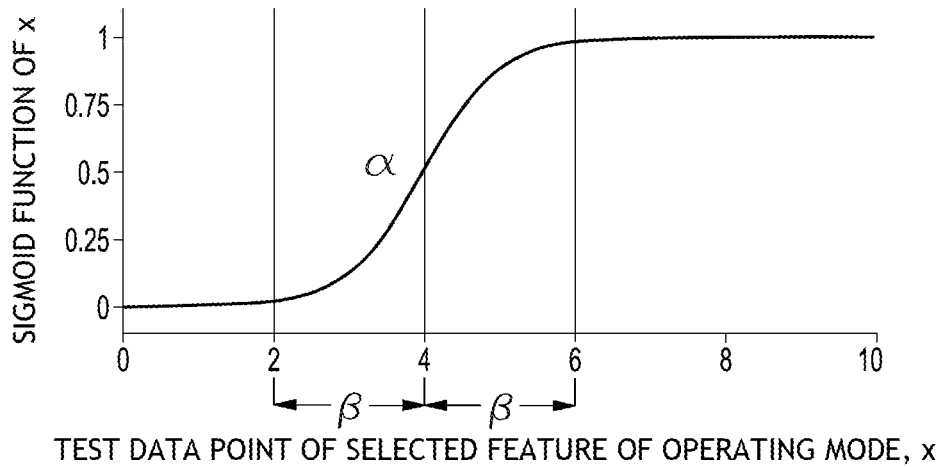
FIGS. 8A, 8B and 8C are plots of a sigmoid function (f(x)), an inverted sigmoid function and a double sigmoid function, respectively.

Plots (not shown) are prepared of the distribution of real power, the distribution of $THD_{>7}$, and the distribution of area in respective modes M4, M3 and M1. These plots are generated from raw data files of about 30 load types and about 2000 raw data files (of pre-acquired data). Based on the corresponding thresholds, sigmoid functions are designed. The sigmoid function (f(x)), such as shown in FIG. 8A, is represented by Equation 4:

$$f(x) = \frac{1}{1 + e^{\frac{-(x-\alpha)}{\beta}}} \quad \text{(Eq. 4)}$$

wherein:

α is the center of the sigmoid function for the selected feature;

β is the width of the sigmoid function for the selected feature;

x is the test data point of the selected feature; and the sigmoid membership function f( ) values are calculated for all input test features for a given cycle of data.

Figure 8B:
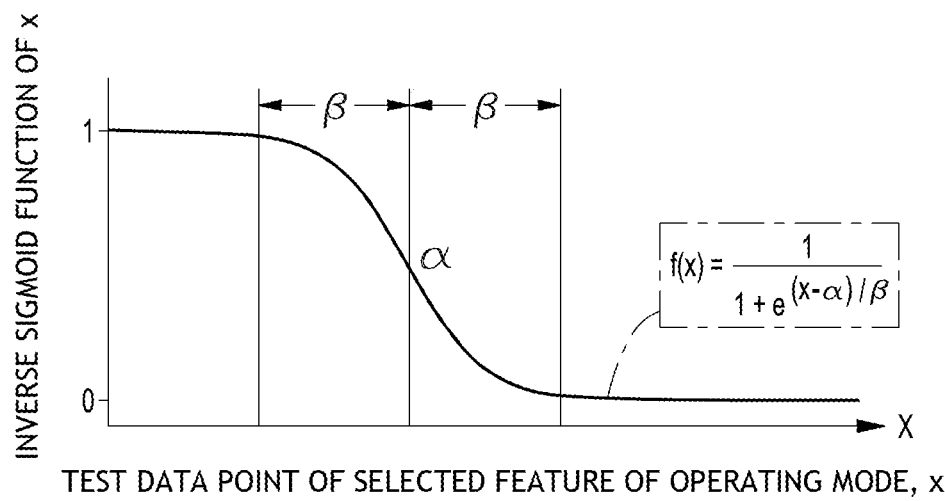
Figure 8C:
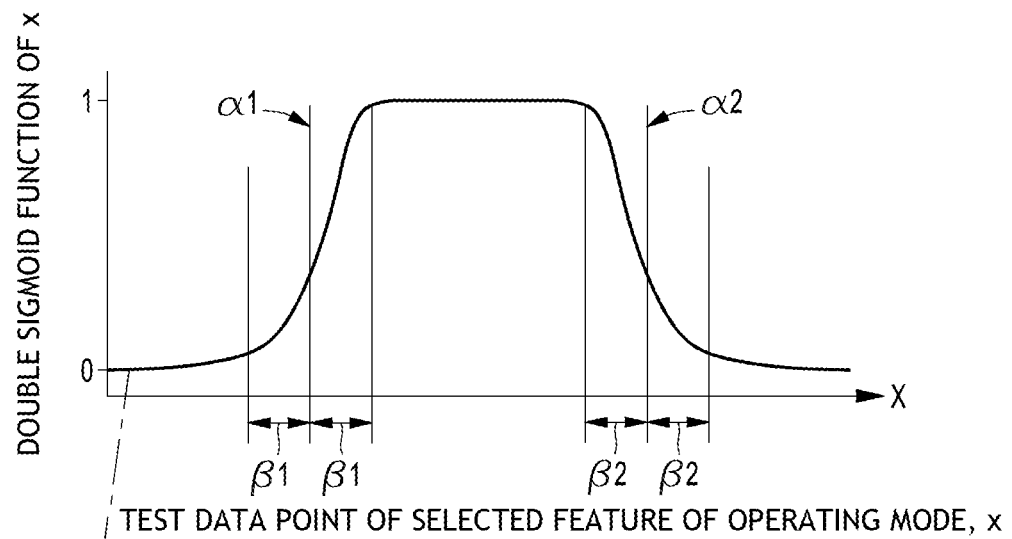

In addition to the example sigmoid function shown in FIG. 8A, other suitable sigmoid functions can include, for example and without limitation, the inverted sigmoid function of FIG. 8B and the double sigmoid function of FIG. 8C.

Table 2 shows non-limiting examples of various membership functions and thresholds used in the disclosed mode detection algorithm:

TABLE 2

| Feature | Membership Function Name | Width (a1) | Center (c1) | Used in the Equation of Mode: |
|---|---|---|---|---|
| Real Power | mf1_1 | −1 | 3 | M4 |
|  | mf1_2 | 1 | 2 | M1 |
|  | mf3_1 | −1 | 10 | M3 |
|  | mf5_1 | 1 | 12 | M1 |
| THD > 7 (%) | mf2_1 | 0.02 | 200 | M4 |
|  | mf2_2 | −0.02 | 250 | M1 |
| Area | mf4_1 | −5 | 1.1 | M3 |
|  | mf4_2 | 5 | −1 | M1 |
|  | mf4_3 | 3.33 | 2 | M3 |
|  | mf4_4 | −3.33 | 2 | M1 |

The mode detection algorithm main logic for M1, M3 and M4 mode differentiation is a follows:

```
if(mf5_1(real power) >= 0.7)
    mode ID = "M1"
else if (area < 0) // negative area
    fnAreaMode3 = mf4_1(area)
```

```
    fnAreaMode1 = mf4_2(area)
else // positive area
    fnAreaMode3 = mf4_3(area)
    fnAreaMode1 = mf4_4(area)
end
```

The probability of the mode being M4, M3 or M1 is calculated from respective Equations 5-7, with the yy[ ] array being sorted in descending order, and the mode with the highest probability being the winner.

$$yy[0]=mf1\_1(realPower)*mf2\_1(THD_{>7}) \quad (Eq.\ 5)$$

$$yy[1]=mf3\_1(realPower)*fnAreaMode3 \quad (Eq.\ 6)$$

$$yy[2]=mf2\_2(THD_{>7})*fnAreaMode1*mf1\_2(realPower) \quad (Eq.\ 7)$$

The end results are available in the yy[ ] array, where yy[0] stores the probability of M4, yy[1] stores the probability of M3, and yy[2] stores the probability of M1. The Mode Type ID first winner is the mode with the highest probability in yy[ ], and the Mode Type ID second winner is the mode with the second highest probability in yy[ ]. The Probability difference=1−(probability of second winner/probability of first winner).

The disclosed mode detection algorithm can be enhanced in the event that M4 and M1 might have overlaps. In that instance:

```
if (mf1_1(realPower) > 0.7 and the highest Probability < 0.3)
    Mode ID = "M4"
end
```

The disclosed mode detection algorithm can also be enhanced in the event that M1 and M3 might have overlaps. In that instance:

```
if (Probability difference < 0.5)
if(first winner = "M3" and second winner = "M1")
    first winner = "M1"
    second winner = "M3"
    probability of first winner(confidence level) = 1
    probability of second winner(confidence level) = 0.1
    Probability difference = 0.9
end
end
```

For M2 detection, M2 is always followed by M1. Thus, in order to detect M2, the load has to go to M1 at least once after its power on. The major difference is only power levels, M2 power is less than M1 power. When the load goes from M1 to M2, the real power step down ratio is <0.5. The logic is:

If the load is detected in 'M1' as per the mode detection algorithm main logic and there is a step down ratio of <0.5, then the mode is assigned as 'M2'.

Figure 9:
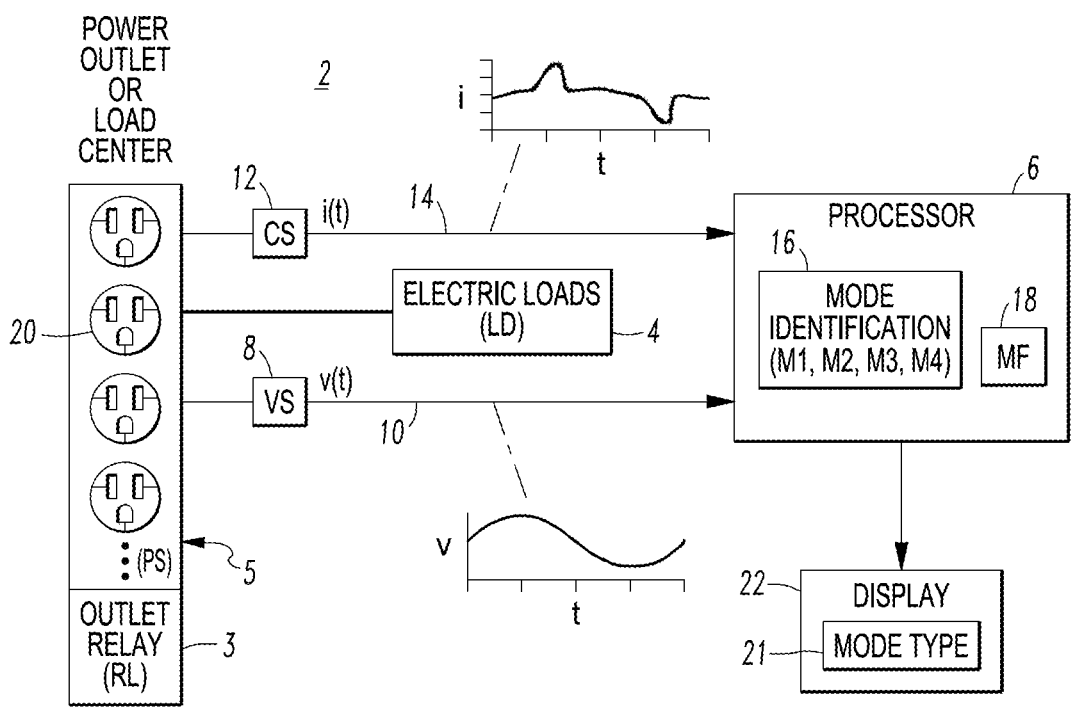
FIG. 9 is a block diagram of an operating mode identification system in accordance with embodiments of the disclosed concept.

FIG. 9 shows the example operating mode identification system 2 which characterizes and identifies one of a plurality of different operating modes M1,M2,M3,M4 of a number of electric loads 4. The system 2 includes a processor 6, a voltage sensor (VS) 8 that provides a voltage signal (v(t)) 10 for one of the electric loads to the processor 6, a current sensor (CS) 12 that provides a current signal (i(t)) 14 for the one of the electric loads to the processor 6, and a routine 16 executed by the processor 6. The routine 16 is structured to characterize the different operating modes M1,M2,M3,M4 using steady state and voltage-current trajectory features determined from the voltage and current signals 10,14, and to identify a particular one of the different operating modes based on a plurality of operating mode membership functions (MF) 18 (e.g., without limitation, as shown in Table 2). The example system 2 includes voltage and current sensing from an outlet 20, capturing and storing a line cycle of data of voltage and current, and calculating the needed features from the captured data including real power, current THD and VI trajectory area, applying the example mode detection routine 16, displaying the final mode identification results 21 on the display 22, and repeating the above for the next progressive line cycles as well.

The overall success rate for offline testing using pre-acquired data, real time simulated testing and real time testing on an embedded platform is shown in Table 3.

TABLE 3

| Mode | Simulated Offline Testing Success Rate (%) | Simulated Real Time Testing Success Rate (%) | Real Time Testing on Embedded Platform Success Rate (%) |
|---|---|---|---|
| No Load (M4) | 90 | 98 | 100 |
| Parasitic Mode (M3) | 85 | 92 | 95 |
| Active Mode (M1) | 99 | 100 | 100 |
| Standby Mode (M2) | 85 | 90 | 92 |

From the above, the disclosed algorithm is able to identify the operating modes with an accuracy of greater than 95% on average.

While for clarity of disclosure reference has been made herein to the example display 22 for displaying, for example, mode identification results, it will be appreciated that such information may be stored, printed on hard copy, be computer modified, or be combined with other data. All such processing shall be deemed to fall within the terms "display" or "displaying" as employed herein.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A system to characterize and identify one of a plurality of different operating modes of a number of electric loads, said system comprising:
    a sensor structured to generate a voltage signal corresponding to a voltage draw of one of said electric loads;
    a current sensor structured to generate a current signal corresponding to a current draw of said one of said electric loads;
    a processor structured to determine a number of steady state and voltage-current trajectory features corresponding to said one of said electric loads with the voltage and current signals, the steady state and voltage-current trajectory features including at least one of total harmonic distortion greater than the seventh harmonic, real power of the voltage and current signals, and area of a voltage-current trajectory plot of the voltage and current signals, to characterize said different operating modes using the steady state and voltage-current trajectory features, and to identify a particular one of said different operating modes using a number of operating mode membership functions each corresponding to one of said steady state and voltage-current trajectory features and one of said different operating modes; and a display structured to display the identified one of said different operating modes, wherein said different operating modes comprise a no load mode, a parasitic mode, an active mode, and a standby mode.

2. The system of claim 1 wherein the processor is structured to identify the active mode if a first one of said membership functions corresponding to real power of the voltage and current signals and the active mode is greater than or equal to a predetermined value and otherwise, if the area of a voltage-current trajectory plot is negative, to determine a first value of a second one of said membership functions corresponding to the area of the voltage-current trajectory plot and the parasitic mode and a second value of a third one of said membership functions corresponding to the area of the voltage-current trajectory plot and the active mode, and otherwise, if the area of the voltage-current trajectory plot is positive, to determine a third value of a fourth one of said membership functions corresponding to the area of the voltage-current trajectory plot and the parasitic mode and a fourth value of a fifth one of said membership functions corresponding to the voltage-current trajectory plot and the active mode.

3. The system of claim 1 wherein the processor is structured to determine a probability of one of said different operating modes from at least one of:

(1) a first product of a first one of said membership functions corresponding to the real power of the voltage and current signals and the no load mode times a second one of said membership functions corresponding to the total harmonic distortion greater than the seventh harmonic and the no load mode, (2) a second product of a third one of said membership functions corresponding to the real power of the voltage and current signals and the parasitic mode times a fourth one of said membership functions corresponding to the area of the voltage-current trajectory plot and the parasitic mode, and (3) a third product of a fifth one of said membership functions corresponding to total harmonic distortion greater than the seventh harmonic and the active mode times a sixth one of said membership functions corresponding to the area of the voltage-current trajectory plot and the active mode times a seventh one of said membership functions corresponding to the real power of the voltage and current signals and the active mode.

4. The system of claim 3 wherein said processor is structured to identify the no load mode in the event that the first one of said membership functions is greater than a first predetermined value, and the first, second and third products are all less than a second smaller predetermined value.

5. The system of claim 3 wherein a probability difference is equal to one minus a second largest one of said first, second and third products divided by the largest one of said first, second and third products; and wherein if the probability difference is less than a predetermined value, and if the second product is the largest one of said first, second and third products and the third product is the second largest one of said first, second and third products, the processor is structured to identify the active mode.

6. The system of claim 3 wherein the processor is structured to, after identifying the active mode corresponding to a first value of the real power, if a subsequent second value of the real power is less than half of the first value, then said processor is structured to identify said standby mode.

7. The system of claim 1 wherein the processor is structured to employ a plurality of said membership functions for each of said steady state and voltage-current trajectory features.

8. The system of claim 1 wherein said processor is structured to, for each line cycle of said voltage and current signals, input and store a line cycle of data from said voltage and current signals, determine the total harmonic distortion greater than the seventh harmonic, the real power of the voltage and current signals, and the area of a voltage-current trajectory plot of the voltage and current signals from the stored line cycle of data.

9. A method to characterize and identify one of a plurality of different operating modes of a number of electric loads, said method comprising:

generating a voltage signal corresponding to a voltage draw for one of said electric loads;

generating a current signal corresponding to a current draw for said one of said electric loads;

determining, with a processor, a number of steady state and voltage-current trajectory features corresponding to said one of said electric loads with the voltage and current signals, the steady state and voltage-current trajectory features including at least one of total harmonic distortion greater than the seventh harmonic, real power of the voltage and current signals, and area of a voltage-current trajectory plot of the voltage and current signals;

characterizing, with said processor, said different operating modes using the steady state and voltage-current trajectory features;

identifying, with said processor, a particular one of said different operating modes using a number of operating mode membership functions each corresponding to one of said steady state and voltage-current trajectory features and one of said different operating modes; and displaying the identified one of said different operating modes, wherein said different operating modes comprise a no load mode, a parasitic mode, an active mode, and a standby mode.

10. The method of claim 9 further comprising:

identifying the active mode if a first one of said membership functions corresponding to the real power of the voltage and current signals and the active mode is greater than or equal to a predetermined value;

otherwise, if the area of the voltage-current trajectory plot of the voltage and current signals is negative, determining a first value of a second one of said membership functions corresponding to the area of the voltage-current trajectory plot and the parasitic mode and a second value of a third one of said membership functions corresponding to the area of the voltage-current trajectory plot and the active mode; and otherwise, if the area of the voltage-current trajectory plot is positive, determining a third value of a fourth one of said membership functions corresponding to the area of the voltage-current trajectory plot and the parasitic mode and a fourth value of a fifth one of said membership functions corresponding to the area of the voltage-current trajectory plot and the active mode.

11. The method of claim 9 further comprising:
calculating a probability of one of said different operating modes from at least one of:
(1) a first product of a first one of said membership functions corresponding to the real power of the voltage and current signals and the no load mode times a second one of said membership functions corresponding to the total harmonic distortion greater than the seventh harmonic and the no load mode,
(2) a second product of a third one of said membership functions corresponding to the real power and the parasitic mode times a fourth one of said membership functions of the area of the voltage-current trajectory plot of the voltage and current signals and the parasitic mode, and
(3) a third product of a fifth one of said membership functions corresponding to the total harmonic distortion greater than the seventh harmonic and the active mode times a sixth one of said membership functions corresponding to the area of the voltage-current trajectory plot and the active mode times a seventh one of said membership functions corresponding to the real power of the voltage and current signals and the active mode.

12. The method of claim 11 further comprising:
identifying the no load mode in the event that the first one of said membership functions is greater than a first predetermined value, and the first, second and third products are all less than a smaller second predetermined value.

13. The method of claim 11 further comprising:
employing a probability difference equal to one minus a second largest one of said first, second and third products divided by the largest one of said first, second and third products; and
if the probability difference is less than a predetermined value, and if the second product is the largest one of said first, second and third products and the third product is the second largest one of said first, second and third products, then identifying the active mode.

14. The method of claim 11 further comprising:
after identifying said active mode corresponding to a first value of the real power of the voltage and current signals, if a subsequent second value of the real power is less than half of the first value, then identifying said standby mode.

15. The method of claim 9 further comprising:
employing a plurality of said membership functions for each of said steady state and voltage-current trajectory features.

16. The method of claim 9 further comprising:
for each line cycle of said voltage and current signals:
inputting and storing a line cycle of data from said voltage and current signals,
calculating the total harmonic distortion greater than the seventh harmonic, the real power of the voltage and current signals, and the area of a voltage-current trajectory plot of the voltage and current signals from the stored line cycle of data.

17. A system to characterize and identify one of a plurality of different operating modes of an electric load, the system comprising:
an outlet structured to electrically connect to the electric load, the outlet including a sensor structured to generate a voltage signal corresponding to a voltage draw of the electric load and a current sensor structured to generate a current signal corresponding to a current draw of the electric load; and
a processor structured to receive the voltage and current signals, to determine a number of steady state and voltage-current trajectory features corresponding to the electric load with the voltage and current signals, the steady state and voltage-current trajectory features including at least one of total harmonic distortion greater than the seventh harmonic, real power of the voltage and current signals, and area of a voltage-current trajectory plot of the voltage and current signals, to characterize said different operating modes using the steady state and voltage-current trajectory features, and to identify a particular one of said different operating modes using a number of operating mode membership functions each corresponding to one of said steady state and voltage-current trajectory features and one of said different operating modes,
wherein said different operating modes comprise a no load mode, a parasitic mode, an active mode, and a standby mode.

18. The system of claim 17, further comprising:
a display structured to display the identified one of said different operating modes.

19. The system of claim 17 wherein said processor is structured to, for each line cycle of said voltage and current signals, input and store a line cycle of data from said voltage and current signals, determine the total harmonic distortion greater than the seventh harmonic, the real power of the voltage and current signals, and the area of a voltage-current trajectory plot of the voltage and current signals from the stored line cycle of data.

20. The system of claim 17 wherein the processor is structured to determine a probability of one of said different operating modes from at least one of:
(1) a first product of a first one of said membership functions corresponding to the real power of the voltage and current signals and the no load mode times a second one of said membership functions corresponding to the total harmonic distortion greater than the seventh harmonic and the no load mode,
(2) a second product of a third one of said membership functions corresponding to the real power of the voltage and current signals and the parasitic mode times a fourth one of said membership functions corresponding to the area of the voltage-current trajectory plot and the parasitic mode, and
(3) a third product of a fifth one of said membership functions corresponding to total harmonic distortion greater than the seventh harmonic and the active mode times a sixth one of said membership functions corresponding to the area of the voltage-current trajectory plot and the active mode times a seventh one of said membership functions corresponding to the real power of the voltage and current signals and the active mode,
wherein said processor is structured to identify the no load mode if the first product is greater than the second and third products, to identify the parasitic mode if the second product is greater than the first and third products, and to identify the active mode is the third product is greater than the first and second products.

* * * * *